US009519209B2

(12) United States Patent
Pruneri et al.

(10) Patent No.: US 9,519,209 B2
(45) Date of Patent: Dec. 13, 2016

(54) OPTICALLY TRANSPARENT AND ELECTRICALLY CONDUCTIVE COATINGS AND METHOD FOR THEIR DEPOSITION ON A SUBSTRATE

(71) Applicants: Fundacio Institut de Ciencies Fotoniques, Castelldefels (Barcelona) (ES); Carl Zeiss SMT GmbH, Oberkochen (DE)

(72) Inventors: Valerio Pruneri, Barcelona (ES); Albert Carrilero, Bacelona (ES); Jan-Hendrik Peters, Radebeul (DE)

(73) Assignees: Fundació Institut de Ciéncies Fotòniques, Castelldefels (Barcelona) (IT); Cark Zeiss SMT GmbH, Oberkochen (DE)

( * ) Notice: Subject to any disclaimer, the term of this patent is extended or adjusted under 35 U.S.C. 154(b) by 133 days.

(21) Appl. No.: 14/351,192

(22) PCT Filed: Oct. 12, 2012

(86) PCT No.: PCT/EP2012/070260
§ 371 (c)(1),
(2) Date: Apr. 11, 2014

(87) PCT Pub. No.: WO2013/053889
PCT Pub. Date: Apr. 18, 2013

(65) Prior Publication Data
US 2014/0295330 A1 Oct. 2, 2014

(30) Foreign Application Priority Data
Oct. 14, 2011 (EP) .................................... 11185280

(51) Int. Cl.
*G03F 1/22* (2012.01)
*G03F 1/38* (2012.01)
*G03F 1/00* (2012.01)
*B82Y 10/00* (2011.01)
*B82Y 40/00* (2011.01)

(52) U.S. Cl.
CPC ................ *G03F 1/22* (2013.01); *B82Y 10/00* (2013.01); *B82Y 40/00* (2013.01); *G03F 1/146* (2013.01); *G03F 1/38* (2013.01)

(58) Field of Classification Search
CPC ............. G03F 1/22; G03F 1/38; G03F 1/146; B82Y 10/00; B82Y 40/00
USPC ......................................................... 430/5
See application file for complete search history.

(56) References Cited

U.S. PATENT DOCUMENTS

| 6,821,682 | B1 | 11/2004 | Stearns et al. | |
|---|---|---|---|---|
| 6,841,786 | B2 | 1/2005 | Kamm | |
| 6,844,272 | B2 | 1/2005 | Taylor et al. | |
| 7,736,821 | B2 * | 6/2010 | Hayashi ................ | B82Y 10/00 428/430 |
| 2006/0115744 | A1 | 6/2006 | Aschke et al. | |
| 2006/0240335 | A1 | 10/2006 | Mitsui | |
| 2007/0160874 | A1 | 7/2007 | Hayashi | |
| 2007/0160916 | A1 | 7/2007 | Ikuta | |
| 2007/0224522 | A1 | 9/2007 | Lee et al. | |
| 2008/0033206 | A1 | 2/2008 | Harris et al. | |
| 2010/0028787 | A1 | 2/2010 | Koike et al. | |
| 2012/0009511 | A1 | 1/2012 | Dmitriev | |

FOREIGN PATENT DOCUMENTS

| DE | 102006054820 | 11/2011 | |
|---|---|---|---|
| EP | 2 139 026 | 12/2009 | |
| EP | 2 133 921 | 2/2011 | |
| EP | 2 317 562 | 5/2011 | |
| EP | 2 317 582 | 5/2011 | |
| JP | S58-024143 A | 2/1983 | ............... G03F 1/00 |
| JP | H07-130645 | 5/1995 | ........... H01L 21/027 |
| JP | 2006-267595 A | 10/2006 | ............... G03F 1/08 |
| JP | 5082857 | 9/2012 | ........... H01L 21/027 |
| WO | WO 2007/069417 | 6/2007 | ........... H01L 21/027 |
| WO | WO 2007/081059 | 7/2007 | ............... G03F 1/14 |

OTHER PUBLICATIONS

Stefano Giurgola et al: "Ultra thin nickel transparent electrodes" J. of Materials Science: Materials in Electronics, Kluwer Academic Publishers, BO, vol. 20, No. 1, Dec. 22, 2007 (Dec. 22, 2007), pp. 181-184, XP019644491, ISSN: 1573-482X.
"Widely transparent electrodes based on ultrathin metals", D.S. Ghosh et al., Opt. Lett. 34, 325-327 (2009).
On the measurement of stress-strain curves by spherical indentation, E.G. Herbert, G.M. Pfarr, W.C. Oliver, B.N. Lucas, J.L. Hay, Thin Solid Films, 398-399 (2001), pp. 331-335.
Japanese Office Action for Japanese Application No. JP 2014-535104 dated Mar. 25, 2015 (11 pages).
Japanese Office Action for Application No. JP 2014-535104 dated Mar. 2, 2016 (4 pages)(with English translation).

* cited by examiner

*Primary Examiner* — Christopher Young
(74) *Attorney, Agent, or Firm* — Fish & Richardson P.C.

(57) ABSTRACT

The present inventions relates to a substrate for a photo-lithographic mask comprising a coating deposited on a rear surface of the substrate, wherein the coating comprises (a) at least one electrically conducting layer, and (b) wherein a thickness of the at least one layer is smaller than 30 nm, preferably smaller than 20 nm, and most preferably smaller than 10 nm.

34 Claims, 11 Drawing Sheets

Figures

OPTICALLY TRANSPARENT AND ELECTRICALLY CONDUCTIVE COATINGS AND METHOD FOR THEIR DEPOSITION ON A SUBSTRATE

1. FIELD OF THE INVENTION

The present invention relates to the field of depositing a coating on a substrate.

2. BACKGROUND OF THE INVENTION

As a result of the constantly increasing integration density in the semiconductor industry, photolithographic masks have to project smaller and smaller structures. In order to fulfil this demand, the exposure wavelength of photolithographic masks has been shifted from the near ultraviolet across the mean ultraviolet into the far ultraviolet region of the electromagnetic spectrum. Presently, a wavelength of 193 nm is typically used for the exposure of the photoresist on wafers. As a consequence, the manufacturing of photolithographic masks with increasing resolution is becoming more and more complex, and thus more and more expensive as well. In order to use significantly smaller wavelengths, lithography systems for the extreme ultraviolet (EUV) wavelength range (approximately 10-16 nm) are presently in development.

Photolithographic masks have to fulfil highest demands with respect to transmission, planarity, pureness and temperature stability. In particular, the surface of reflective masks for EUV radiation coated with the reflective structure has to be plane within the range of about 1 nm in order to avoid aberrations of the desired structure in the photoresist of the wafer. These challenges also apply for other EUV reflective optical elements, as for example mirrors used in the beam path of EUV lithography systems.

The above mentioned challenges require highly precise techniques for the production of the substrates of EUV optical elements. However, even the best production techniques cannot guarantee surface variations below 1 nm. Moreover, the fabrication of mask blanks and/or EUV optical elements from mask blanks may additionally induce further defects in the EUV substrates, and/or thus also in the EUV optical elements. It is therefore necessary to correct defects of EUV optical elements in order to establish an economical production process for these components.

On the other hand, an extremely careful and precise handling and holding of EUV mask blanks and/or EUV optical elements is necessary in order to avoid as far as possible mechanical abrasion and/or the formation of particles from the EUV optical element which may deteriorate the function of an EUV lithography system. Since an EUV optical element is used to expose a large number of semiconductor substrates or wafers, a high effort in terms of production and handling of EUV optical elements is almost always justified.

In order to fulfil these handling requirements, mask EUV blanks are held on an electrostatic chuck during the fabrication of an EUV optical element. Further, EUV masks are also held with an electrostatic chuck in the lithography system during the wafer illumination. As the substrate of EUV optical elements typically comprises a dielectric material or a semiconducting material, an electrically conducting layer has to be deposited on the rear side of a substrate in order to be able to hold the substrate with an electrostatic chuck during the fabrication and/or operation of the optical element.

The US 2006/0115744 A1 discloses a method for producing of a mask blank having an electrically conducting layer on a rear side of the substrate of an EUV photomask. The metallic layer has a layer thickness of around 100 nm. The abrasion resistance of the metallic layer have been investigated by comprehensive abrasion tests in order to check whether a mask blank coated on the rear side with an electrically conducting layer can be handled with electrostatic chucks without the risk of mechanical abrasion.

As already mentioned, errors already introduced in the substrate during the substrate production and/or introduced during the fabrication process of the EUV optical element have to be corrected at the end of the production process of the EUV optical element. Moreover, defects may evolve in the course of the operation of an EUV mask in a lithography system.

It is already known that a surface of an EUV optical element can be modified in a controlled manner in order correct planarity and/or placement defects by applying ultrashort laser pulses into the substrate of an optical element (cf. U.S. Pat. No. 6,841,786 B2, DE 10 2006 054 820 A1, U.S. Ser. No. 13/179,799 A1, U.S. Pat. No. 6,844,272 B2, U.S. Pat. No. 6,821,682 B2, US 2007/0 224 522, and US 2008/0 033 206).

This defect compensation occurs through the rear side of the EUV optical element as the ultra-short laser pulses cannot penetrate the multi-layer structure, which forms the reflective optical element arranged on the front surface of the EUV optical element. Consequently, the electrically conducting layer deposited on the rear side for holding the EUV optical element with an electrostatic chuck has also to be optically transparent for the ultra-short laser pulses.

The European Patent Application EP 2 317 582 A1 discloses a thin layered structure as an electrode for optoelectronic devices, wherein the thin layered structure is also optically transparent. The thin layered structure comprises at least one thin metal film and at least one ultra-thin metal film, wherein the two films or layers have different materials.

The European Patent specification EP 2 133 921 B1 describes an ultra-thin metallic transparent electrode which is thermally treated in an ambient atmosphere or optionally in combination with an oxygen treatment in order to make the ultra-thin coating stable against environmental stress.

As being held on an electrostatic chuck, rear side coatings of EUV optical elements have in addition of being electrically conducting and optically transparent also to fulfil specific mechanical requirements. For example, the pins of an electrostatic chuck or particles may indent in the surface coating on the substrate rear side. Moreover, the rear side coating has to withstand the lateral accelerations occurring during the mask scanning process. For this reason, as already explained in the US 2006/0115744 A1, the coating on the rear side of the substrate of an EUV optical element has to withstand abrasion during the handling of mask blank and/or the EUV optical element with an electrostatic chuck. Further, the electrical conductivity of the rear side coating has to be high enough, so that the mask blank and/or the EUV optical element can securely be handled with an electrostatic chuck. Moreover, the rear side coating has to be optically transparent, so that ultra-short laser pulses with a high optical intensity can be applied through the coating into the substrate of the mask blank and/or the EUV optical element.

It is therefore one object of the present invention to provide a coating and a method for depositing the coating on a substrate of a photolithographic mask that is electrically conducting, optically transparent and additionally has suitable mechanical properties.

3. SUMMARY OF THE INVENTION

According to a first aspect of the invention, an apparatus according to patent claim 1 is provided. In an embodiment, the apparatus comprises a substrate for a photolithographic mask comprising a coating deposited on a rear side surface of the substrate, the coating comprises (a) at least one electrically conducting layer, and (b) wherein a thickness of the at least one layer is smaller than 30 nm, preferably smaller than 20 nm, and most preferably smaller than 10 nm.

Electrically conducting coatings having the defined thickness are also at least partially optically transparent. Additionally, inventive coatings fulfil specific mechanical requirements. They are mechanically resistant against delamination. The defined coatings are ductile, and thus do essentially not introduce bending stress in the substrate of an EUV optical element. Furthermore, inventive coatings have a strong adhesion and elasticity against indentation. Thus, the coating does preferably not show a mechanical failure before a failure of the substrate of the optical EUV element. In case the coating releases particles during the operating of the EUV optical element, these particles are small enough in size and numbers so that they do not prevent the function of the EUV optical element.

Moreover, inventive coatings have a smooth surface. They do essentially not generate unwanted particles during the operation life-time of the EUV optical element. Therefore, mask blanks and/or EUV optical elements having a substrate with an inventive coating are well suited for being held with an electrostatic chuck. Furthermore, ultra-short laser pulses can transmit inventive coatings in a controlled manner.

In a further aspect, the at least one layer comprises an optical transmittance of more than 20%, preferably more than 40% and most preferably more than 60%.

A high transmittance leads to a low portion of absorbed optical intensity in the coating layer, and thus results in a low thermal load of the coating layer.

Generally, but in particular in case of a low transmittance of the coating, it is preferable that the at least one layer forming the coating reflects incident light rather than absorbing it. A low thermal load of the coating layer during light exposure is also beneficial with respect to the stress at the interface between the coating layer and the substrate which prevents an unwanted removal of the coating layer from the substrate.

According to another aspect, the optical transmittance of the at least one layer comprises a wavelength range of 300 nm-1100 nm, preferably 400 nm-1000 nm, and most preferably 500 nm-900 nm.

The defined wavelength range comprises essentially the visible part of the electromagnetic spectrum. However, if the ultra-short laser pulses used for the correction of substrate and/or multilayer defects require a transparent window in the infrared (IR) or the ultraviolet (UV) wavelength range, the transparent window can also be shifted toward longer or shorter wavelengths of the electromagnetic spectrum. A shift of the transparent window toward longer wavelengths is presently preferred as the reflected portion of the incident light increases at longer wavelength at the expense of the absorption.

In another aspect, the at least one layer comprises a sheet resistance of smaller than 200 Ω/sq, preferably smaller than 100 Ω/sq, and most preferably of smaller than 50 Ω/sq.

In the presently preferred application, the electrically conducting coating layer is applied to hold a EUV mask blank and/or an EUV optical element on an electrostatic chuck. Therefore, only currents due to an electrostatic induction are flowing within the coating layer. This means that the amount of current flowing in the coating layer is moderate.

In a further aspect, the thickness of the at least one layer is larger than 0.2 nm.

As already mentioned, the current capability of the coating layer may be limited. Therefore, the thickness of the coating layer can be selected to be very thin. The deposition of an extremely thin coating layer has the advantage that the optical transmittance of the coating layer is high.

In a beneficial aspect, the at least one layer comprises at least one metal. In another aspect, the at least one metal comprises nickel (Ni), chromium (Cr), aluminum (Al), gold (Au), silver (Ag), copper (Cu), titanium (Ti), wolfram (W), indium (In), platinum (Pt), molybdenum (Mo), rhodium (Rh), and/or zinc (Zn) and/or mixtures of at least two of these metals.

Typically, metals have a high absorption coefficient at short wavelengths due to intraband electronic transitions and show a high reflectivity at long wavelengths due to their electron plasma. Sufficiently thin metallic layers are optically transparent or at least partially transparent (cf. EP 2 317 562 A1 and EP 2 133 921 B1 cited in the introductory part of the description). In particular, thin metallic layers can become highly transparent, in some cases over a wide range from the UV (approximately 200 nm) to the IR (at about 25 μm) (cf. "Widely transparent electrodes based on ultrathin metals", D. S. Ghosh et al., Opt. Lett. 34, 325-327 (2009)).

On the other hand, metals have a high specific electrical conductivity so that even very thin layers can be fabricated with a small sheet resistance. Typically, metals have higher thermal expansion coefficients than EUV substrates. However, metals are ductile so that very thin layers can adapt to the material expansion of EUV substrates. The ductility of metals is also very beneficial with respect to small particles available on the electrostatic chuck. Moreover, the strong adhesion of the coating layer prevents delamination of parts of the coating also under high applied loads. In the event of delamination or the formation of particles from the thin coating itself, these particles are more likely of small size due to the small thickness of the coating. The smaller the particles the less effect they have on the performance of the EUV lithography system. Thus, thin metals have excellent material properties required for the handling of mask blanks or EUV optical elements.

In another beneficial aspect, at least one layer comprises graphene and/or a multiple layer structure of graphite.

Graphene has a high electrical conductivity and graphene layers having a thickness of less than 50 nm show a very high optical transmittance. Thus, the deposition of a single layer of graphene and/or multiple layers of graphite allow the fabrication of extremely thin layers having a high optical transmittance and at the same time a low sheet resistance.

In a further favourable aspect, the at least one layer comprises at least one first layer and at least one second layer, wherein the at least one first layer comprises at least one first metal and the at least one second layer comprises at least one second metal. In another aspect, the at least one layer comprises at least one first layer and at least one second layer, wherein the at least one first layer comprises a metal and the at least one second layer comprises a graphene. According to another aspect, a thickness of the at least one first layer and the at least one second layer is less than 15 nm, preferably less than 10 nm, and most preferably less than 5 nm.

Fabricating a coating with two or more layers increases the flexibility in the design of the coating. This approach allows adapting a specific combination of electrical, optical and mechanical properties to a specific application. The overall thickness of a coating which comprises two or more layers is the thickness range of a coating having a single layer.

According to another aspect, the at least one layer comprises at least one first layer comprising at least one metal and the at least one second layer comprising at least one metal oxide. In a further aspect, the at least one layer comprises at least one first layer comprising at least one metal and the at least one second layer comprising at least one metal nitride. In still a further aspect, the thickness of the at least one first layer is less than 15 nm, preferably less than 10 nm, and most preferably less than 5 nm and the thickness of the at least one second layer is less than 10 nm, preferably less than 5 nm, and most preferably less than 3 nm.

This feature combines the flexibility in the design of the coating with the possibility to take environmental consideration into account. The formation of a defined oxide and/or nitride film protects the underlying metal coating layer from being attacked by the atmospheric oxygen and can provide an additional mechanical strength.

According to another aspect, the at least one layer comprises at least one first layer comprising at least one graphene single layer or graphene multilayer and at least one second layer comprising at least one metal oxide and/or at least one metal nitride. In a further aspect, the at least one layer comprises at least one first layer comprising at least one single graphene sheet or graphene sheets ant the at least one second layer comprising at least one metal nitride. In still a further aspect, the thickness of the at least one first layer is less than 15 nm, preferably less than 10 nm, and most preferably less than 5 nm, and the thickness of the least one second layer is less than 10 nm, preferably less than 5 nm, and most preferably less than 3 nm.

In still another aspect, the substrate comprises a material having a low thermal expansion coefficient. In still another aspect, the substrate comprises fused silica.

For example, fused silica is a material having a low thermal expansion (LTE) coefficient. Other suitable LTE materials can be used as substrate materials as for example transparent dielectrics, glass materials and/or semiconductor materials. ZERODUR®, ULE® and CLEARCERAM® are product examples of materials having a low thermal expansion (LTE) coefficient. The application of LTE material for EUV substrates helps to fulfil the temperature stability requirements of EUV optical elements.

In still another aspect, a front surface of the substrate comprises a multilayer structure. According to a further aspect, a front surface comprises an absorbing layer forming pattern elements of an extreme ultraviolet photolithographic mask.

Due to the extremely short wavelength, EUV masks have to be plane within the range of about 1 nm. The defined coating opens the possibility to correct among other things planarity defects of completely fabricated EUV masks by introducing ultra-short laser pulses through the defined coating into the substrate of an EUV mask.

According to a further aspect, the at least one layer comprises an area of 148 mm×148 mm. In yet another aspect, the thickness of the at least one layer varies less than ±5%, preferably less than ±2% across the area of the at least one layer. In still a further aspect, a surface roughness of the at least one layer across an area of up to 100 $\mu m^2$ is ≤0.6 nm route mean square.

The defined coatings can be fabricated for small areas in the millimeter or even sub-millimeter range, but can also be deposited on large areas with a high constant quality across the overall area. A smooth surface of the coating enable a precise control of the optical intensity locally applied by ultra-short laser pulses into the substrate of an EUV mask blank and/or EUV optical element for defect compensation.

In still a further aspect, a composite Young's modulus of the at least one layer deposited on the substrate and the substrate comprises a range of 20 GPa-70 GPa, preferably 30 GPa-60 GPA, and most preferably 40 GPa-50 GPa.

At the deposition of ultra-thin coatings it is not sufficient to consider the material properties of the substrate and the coating layer separately. Rather, the properties of the combined structure characterise the material system coating and substrate. The range of the defined composite material parameters leads to rear side coatings on EUV substrates having a beneficial combination of the electrical, optical and mechanical properties.

According to still another aspect, the substrate is a substrate for an extreme ultraviolet photolithographic mask. In yet a further aspect, the coating electro-statically chucks the extreme ultraviolet photolithographic mask during its operation and the at least one layer allows transmitting of ultra-short laser pulses through the coating into the substrate, wherein the ultra-short laser pulse having a focal point spot diameter of 1 μm and a maximum optical intensity of $10^{20}$ $W/cm^2$.

As already mentioned the rear side coatings of EUV substrates do not have to fulfil highest demands for the electrical conductivity. But the coatings have to withstand highest optical intensities without inducing any damage in the coating and/or in the substrate. Further, the coatings may not modify the optical beam in an uncontrolled way. This results in strict specifications for the thickness homogeneity and the surface roughness of the coating layer in order to guarantee predetermined specifications of the reflection and/or of the absorption of ultra-short laser pulses.

According to a further aspect, a method for depositing a coating on a substrate of a photolithographic mask comprises (a) depositing at least one electrically conducting layer on the substrate, and (b) wherein a thickness of the at least one layer is smaller than 30 nm, preferably smaller than 20 nm, and most preferably smaller than 10 nm.

In another aspect, depositing the at least one layer comprises a physical vapor deposition method. According to a further aspect the physical vapor deposition method comprises a sputter deposition method. In still a further aspect, the physical vapor deposition method comprises a reactive deposition.

The deposition occurs in a high vacuum chamber. This allows precisely controlling the composition and thickness of the deposited layer. Further, the temperature of the substrate in the vacuum chamber can be adjusted to a predetermined level prior to the deposition process in order to secure a high quality of the deposited layer.

According to a further aspect, depositing the at least one layer comprises a thermal evaporation of a material of the at least one layer. In still another aspect, depositing the at least one layer comprises an evaporation of the material of the at least one layer by an electron beam. In a further aspect comprises the step of combining the thermal evaporation of the material or the evaporation by an electron beam with an ion assisted deposition. In yet a further aspect, depositing the least one layer comprises a chemical vapor deposition. According to another aspect, depositing the at least one layer comprises a molecular beam deposition.

Graphene can be grown on metallic substrates by using a chemical vapour deposition process. Then the metal substrate can be resolved and the graphene monolayer is transferred to the rear side of a substrate which is used for the generation of EUV optical elements.

Finally, another aspect further comprises the step of forming a metal oxide from a metal in the at least one layer using a thermal treatment of the at least one layer in an ambient atmosphere and/or in an oxygen plasma atmosphere. Yet, a further aspect comprises the step of forming a metal nitride from a metal in the at least one layer using a thermal treatment of the at least one layer in nitrogen plasma atmosphere.

Alternatively, it is also possible to form a metal oxide already at the deposition in an atmosphere of oxygen and hydrogen instead of a post deposition thermal treatment.

As a consequence of the extreme short operation wavelength, EUV lithography systems have to operate in a vacuum environment. Thus, defined coating layers deposited on EUV mask substrates should not have any oxidation problem. Nevertheless, it is possible to form an extremely thin oxide and/or nitride layer on a thin metallic coating layer in a controlled manner. This enables to protect defined coatings for other applications from the reaction with reactive substances in the environment, as for example the oxygen in the ambient air. An uncontrolled modification of the deposited coating during its operation life-time can thus be prevented.

4. DESCRIPTION OF THE DRAWINGS

In order to better understand the present invention and to appreciate its practical applications, the following figures are provided and referenced hereafter. It should be noted that the figures are given as examples only and in no way limit the scope of the invention.

Figure 1:
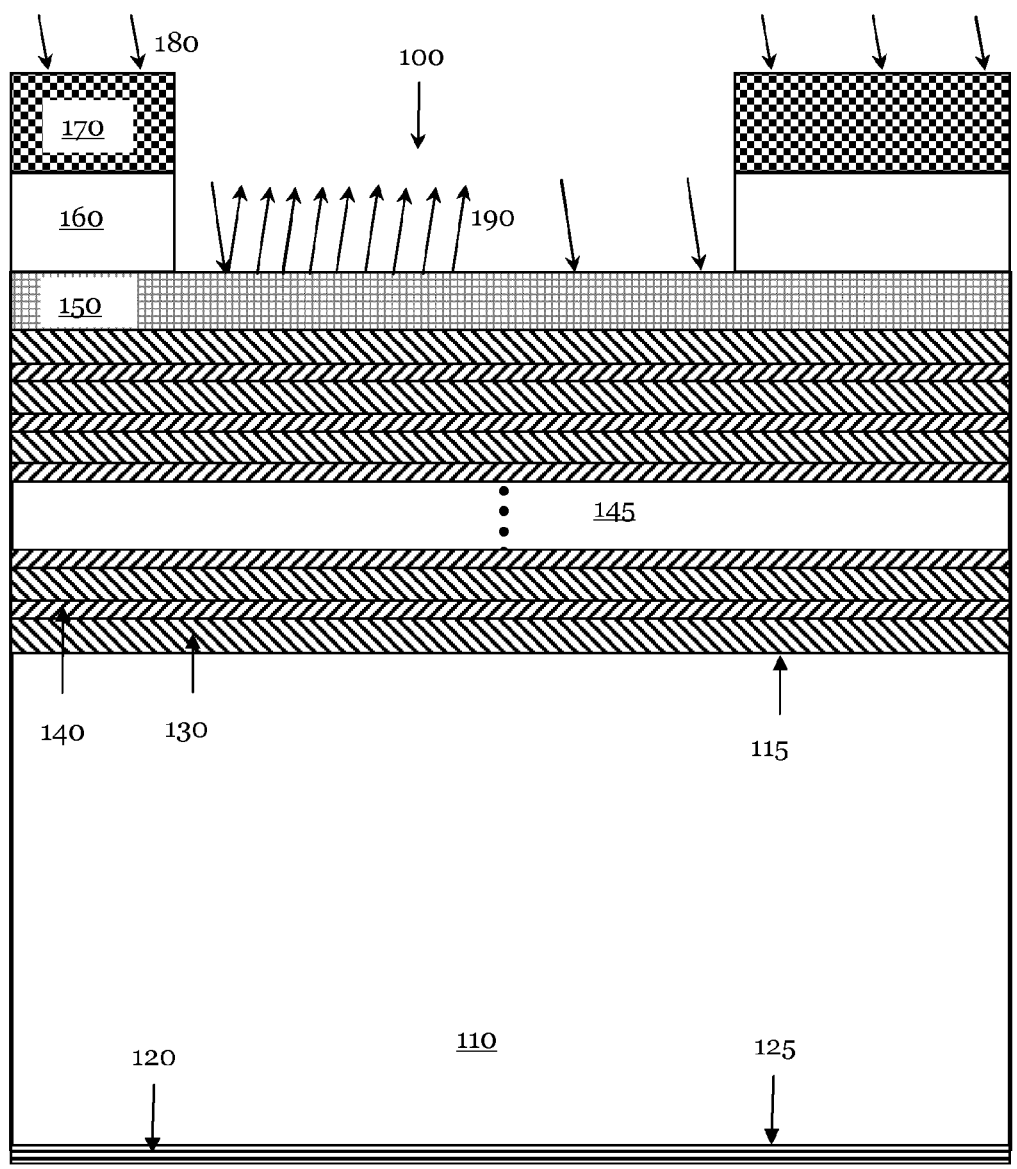
FIG. 1 shows in cross-section a schematic view of an EUV photolithographic mask.
Figure 3:
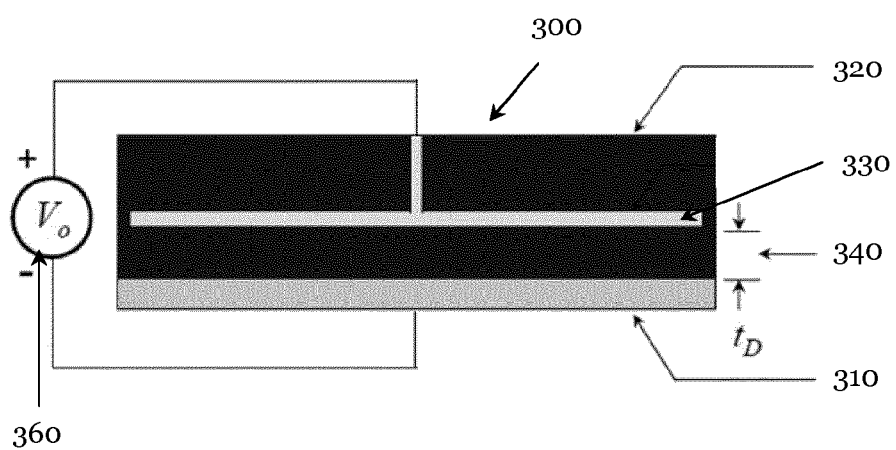
Figure 4:
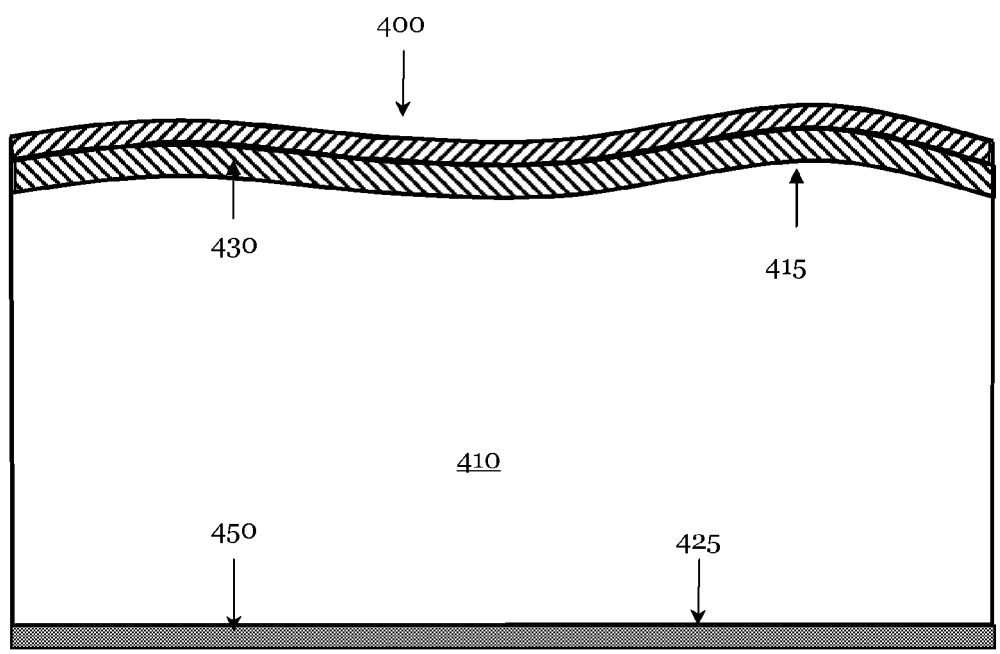
Figure 5:
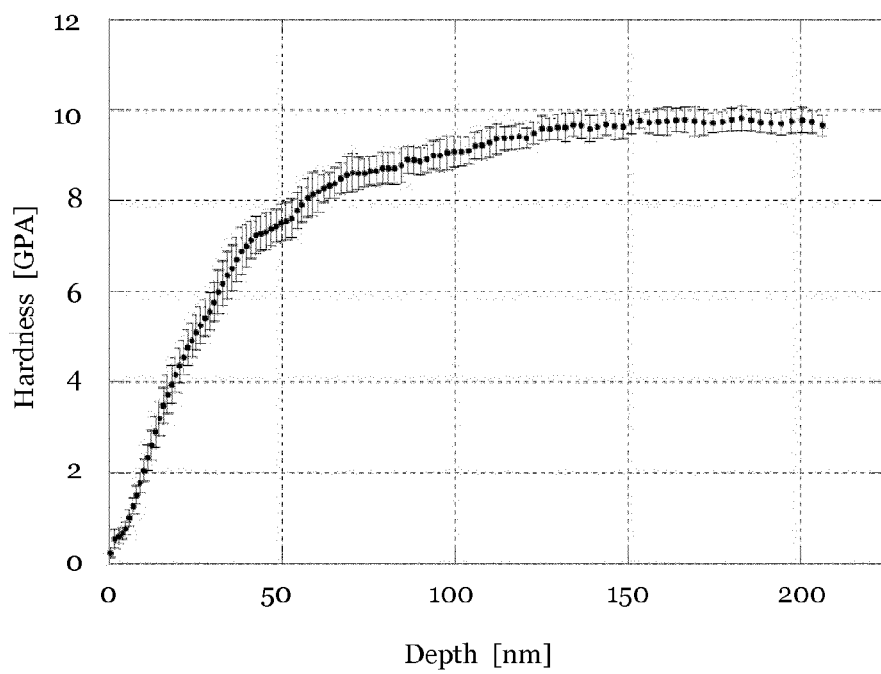
Figure 6:
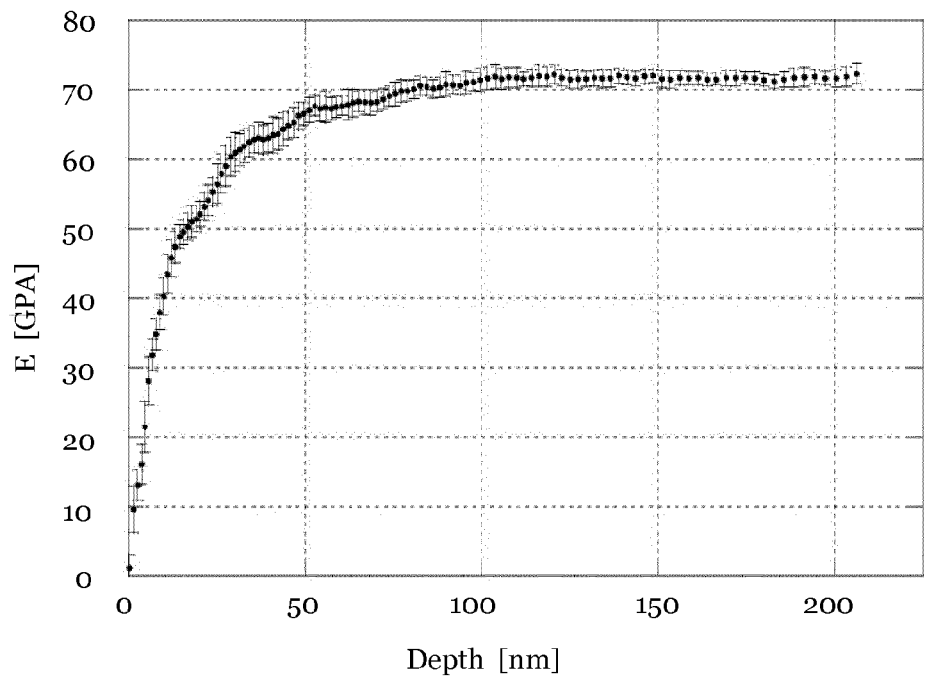
Figure 7:
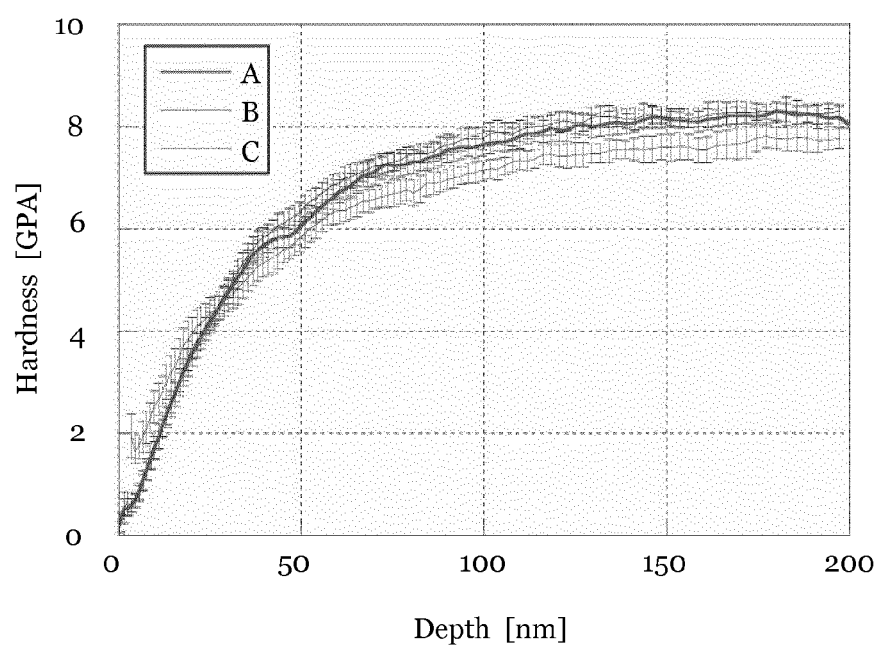
Figure 8:
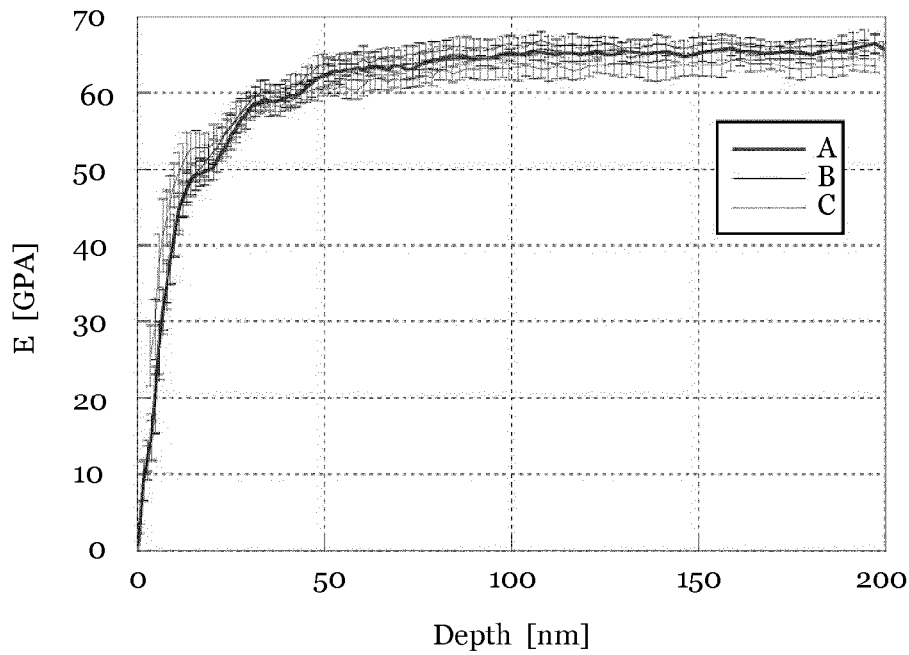
Figure 9:
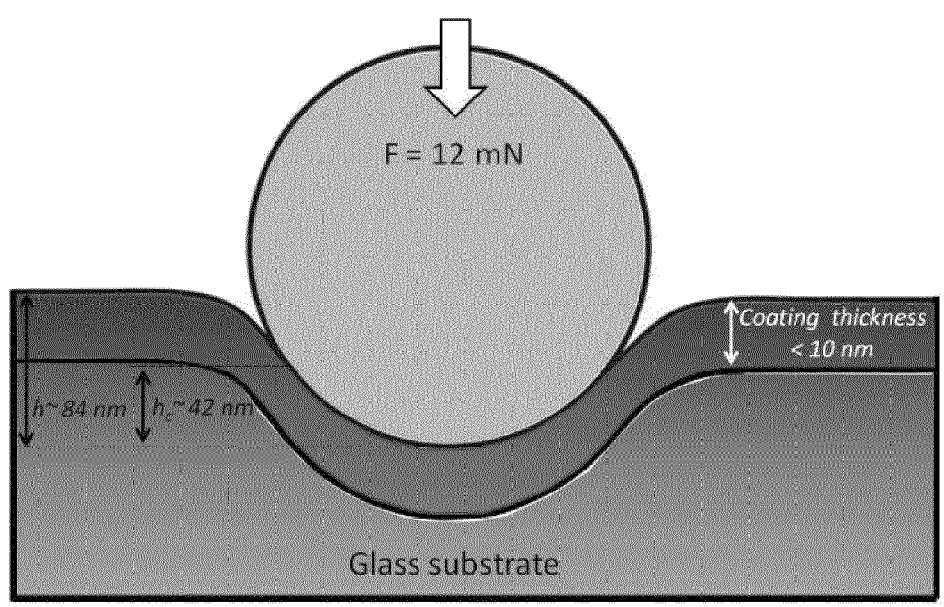
Figure 10:
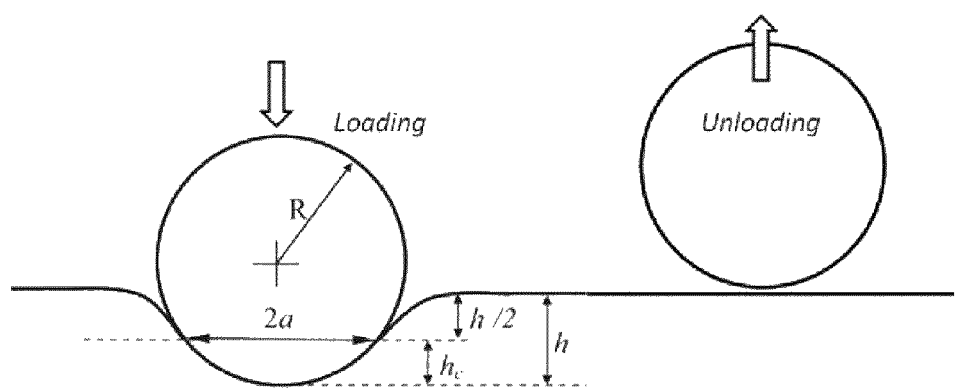
Figure 11:
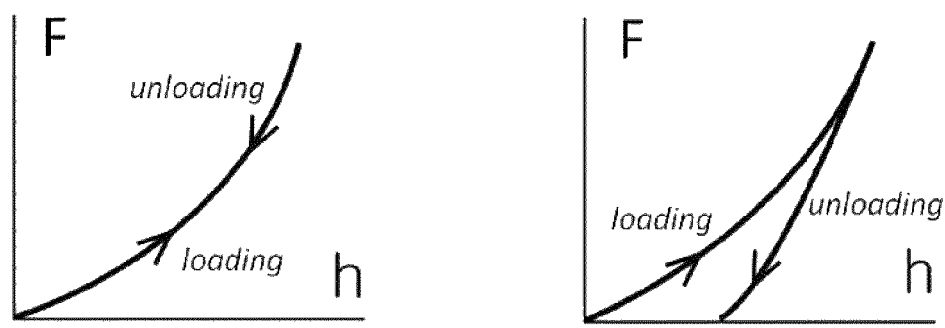
Figure 12:
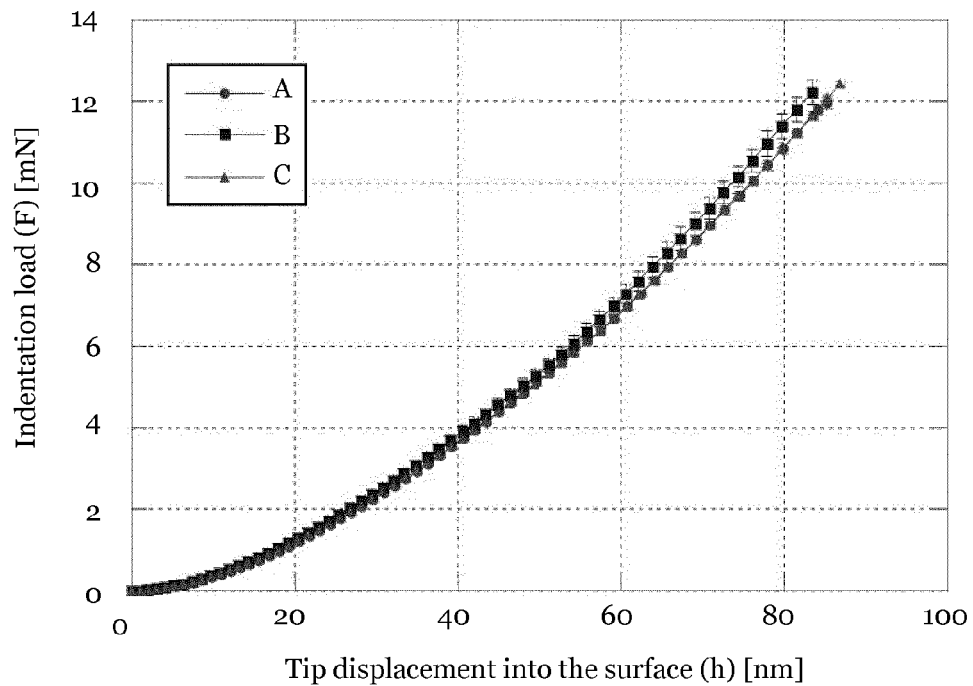
Figure 13:
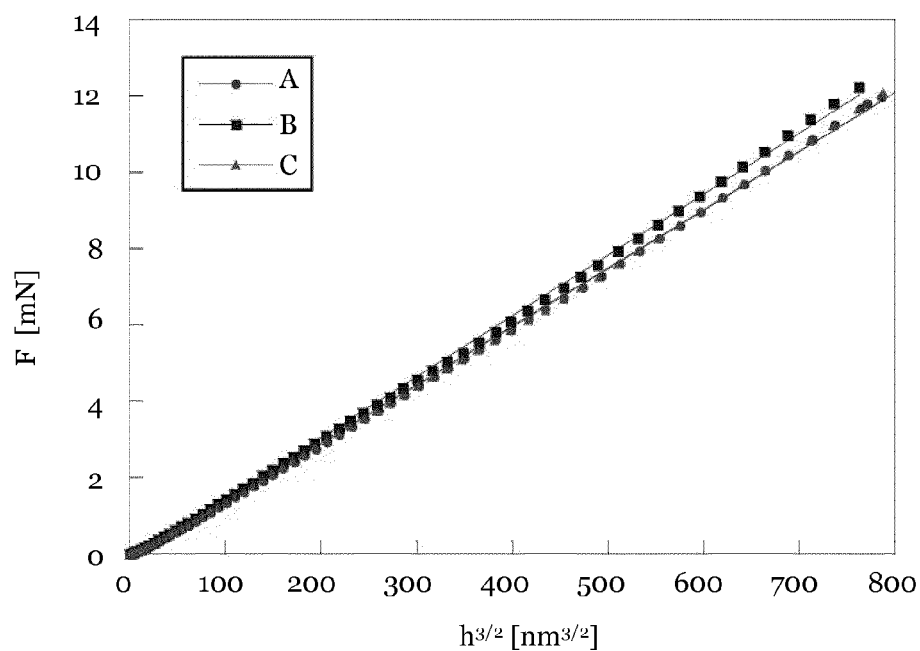
Figure 14:
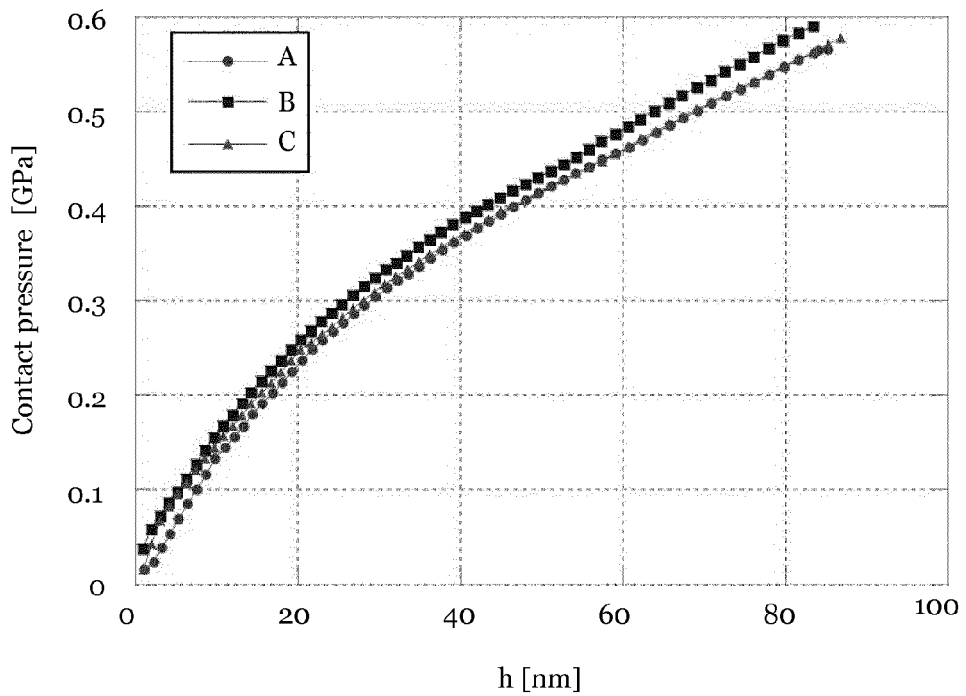
Figure 15:
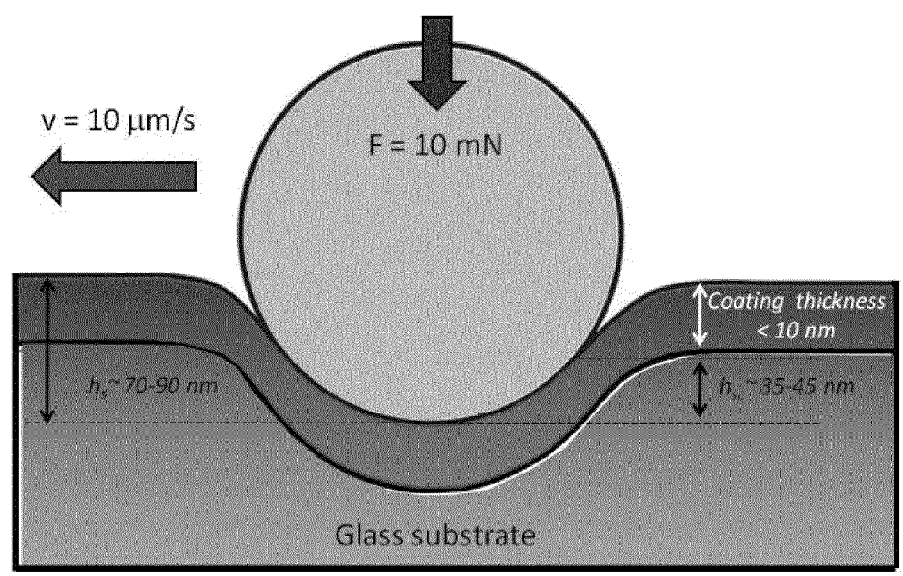
Figure 16:
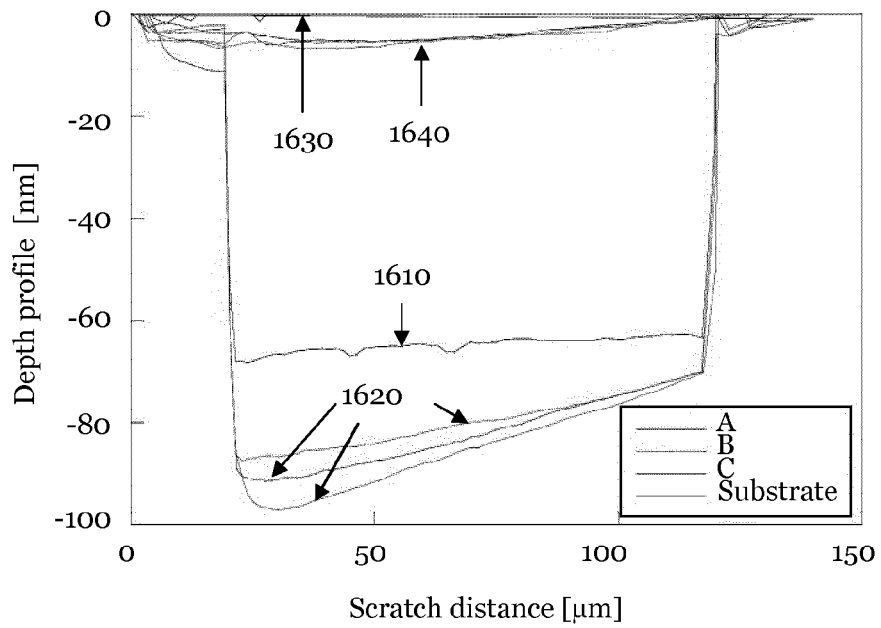
Figure 17:
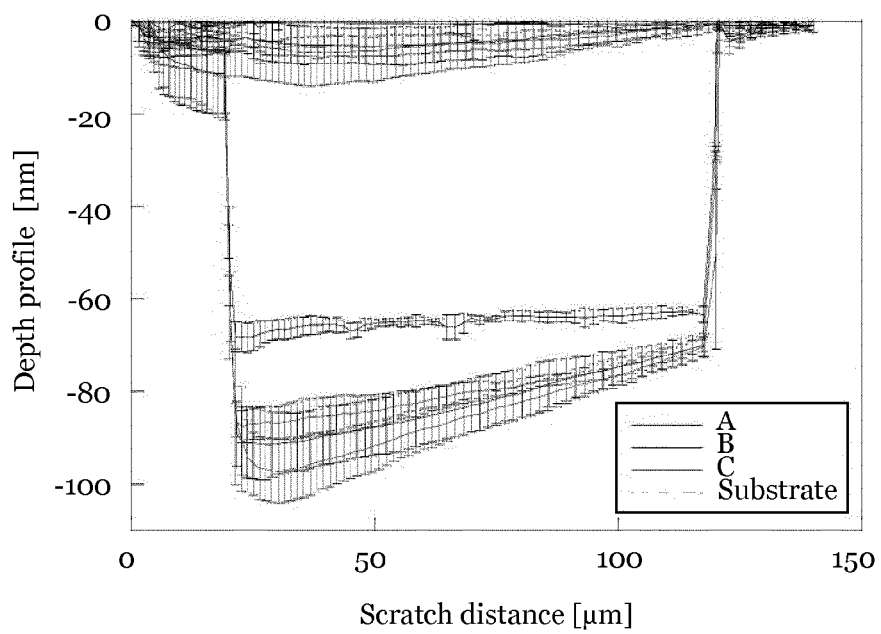
Figure 18:
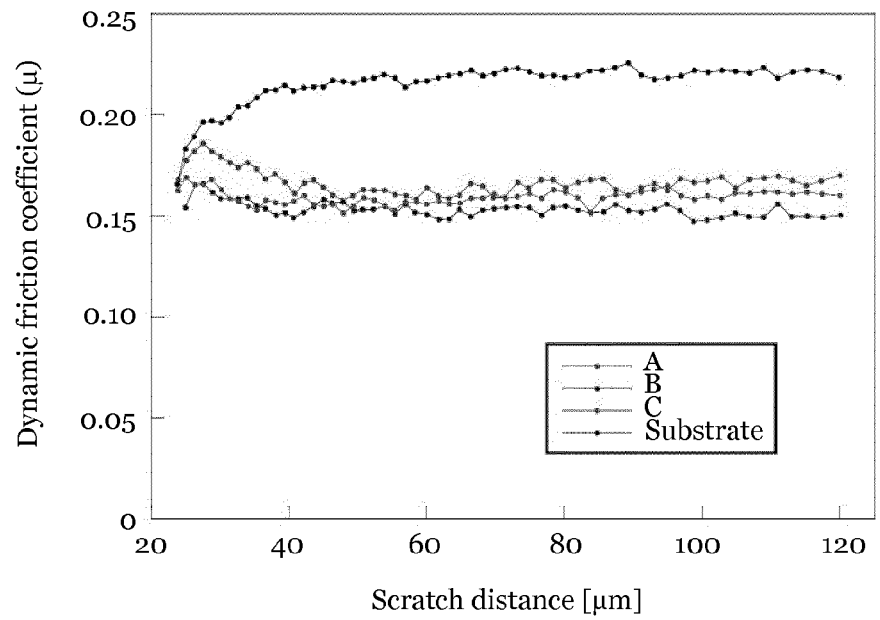
Figure 19:
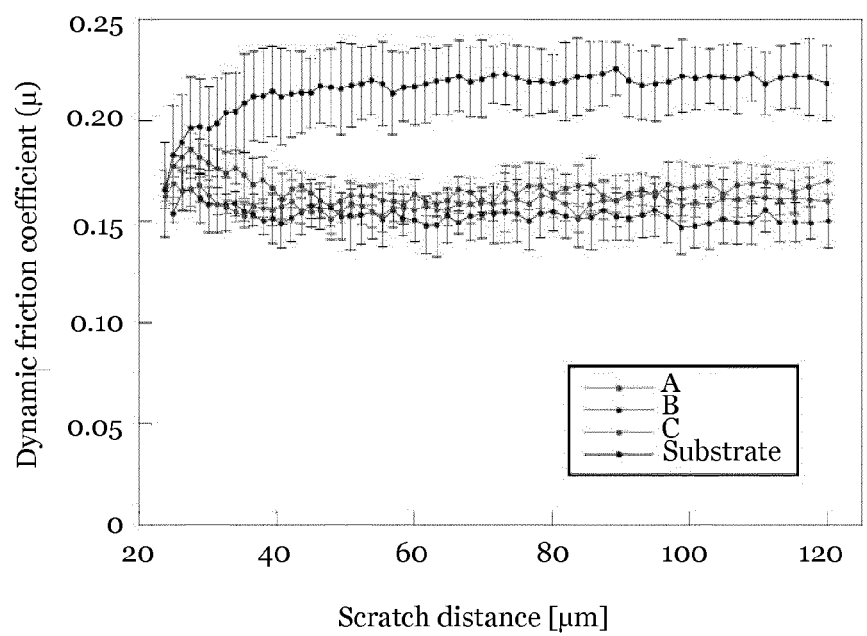
Figure 20:
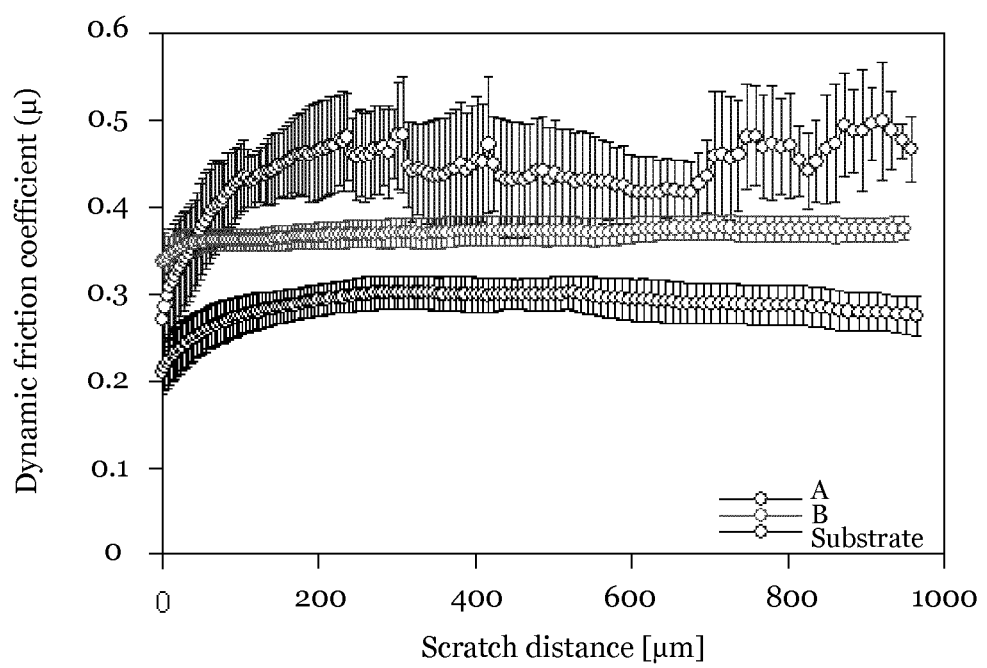

FIG. 3 schematically shows a photolithographic mask held by an electrostatic chuck;

FIG. 4 depicts a schematic representation of a substrate of an EUV photolithographic mask having a transparent conductive coating at the rear substrate surface and an uneven front substrate surface with a single layer of the multi-layer system of FIG. 1;

FIG. 5 presents a hardness depth profile measurement of a low temperature coefficient (LTE) glass reference sample;

FIG. 6 depicts a Young's modulus profile determination of the LTE glass reference sample used as a substrate;

FIG. 7 shows hardness depth profile measurements of three thin metal coatings deposited on the substrate of FIG. 5;

FIG. 8 presents Young's modulus depth profile determination for the three thin metal coatings of FIG. 7;

FIG. 9 schematically depicts a static load indentation apparatus with a spherical sapphire tip (79 μm radius) for a hardness and Young's modulus determination of a thin coating layer arranged on the LTE glass reference sample used as a substrate;

FIG. 10 schematically represents a spherical indentation into a material within its elastic range;

FIG. 11 schematically illustrates loading-unloading curves for an elastic contact (left) and an elastic-plastic contact (right);

FIG. 12 presents spherical indentation curves of the three thin coating layers deposited on the LTE glass reference sample used as a substrate;

FIG. 13 depicts the spherical indentation curves of FIG. 12 as function of $h^{3/2}$ and fitting to Hertz equation;

FIG. 14 shows the mean indentation contact pressure of the three samples of FIG. 13 as a function of the total tip displacement into the surface;

FIG. 15 schematically represent the nano-scratch testing apparatus with a spherical sapphire tip (79 μm radius) under a normal load of 10 mN and at a tip scratch velocity of 10 μm/s;

FIG. 16 represents scratch depth profiles for the reference substrate (LTE glass) and the three sample coatings used for the static-load indentation measurements;

FIG. 17 depicts the scratch depth profiles of FIG. 16 and additionally indicates the error bars of the measurements;

FIG. 18 shows the dynamic friction coefficients performed with a spherical sapphire tip (79 μm radius) for the reference substrate and the three thin coating layers of FIG. 16 s as a function of the scratch distance;

FIG. 19 represents the dynamic friction coefficients of FIG. 18 and additionally shows the error bars of the measurements; and FIG. 20 shows the dynamic friction coefficients with a cylindrical glass flat punch tip (500 μm radius) for the reference LTE glass substrate and samples B and C as a function of the scratch distance.

5. DETAILED DESCRIPTION OF PREFERRED EMBODIMENTS

In the following, the present invention will now be described in more detail hereinafter with reference to the accompanying figures, in which exemplary embodiments of the invention are illustrated. However, the present invention may be embodied in different forms and should not be construed as limited to the embodiments set forth herein. Rather, these embodiments are provided so that this disclosure will be thorough and will convey the scope of the invention to persons skilled in the art.

FIG. 1 shows a schematic cross-sectional view of a photolithographic mask 100 for an exposure wavelength of 13.5 nm. Different from presently applied photolithographic masks, the mask 100 is a reflective optical element based on a multi-layer mirror structure 145. The multi-layer mirror system 145 of photolithographic mask 100 is deposited on a front substrate surface 115 of a suitable substrate 110, such as a fused silica substrate. Other transparent dielectrics, glass materials or semiconducting materials may also be applied as substrates for photolithographic masks as for example ZERODUR®, ULE® or CLEARCERAM®.

In the example of FIG. 1, the multi-layer mirror system 145 comprises 40 pairs of alternating molybdenum (Mo) 130 and silicon (Si) layers 140 (referred to in the following as MoSi layers). The thickness of each Mo layer 130 is 4.15 nm and that of the Si layer 140 amounts to 2.80 nm. In order to protect the multi-layer structure 145, a capping layer 150 of silicon with a native oxide of 7 nm depth is arranged on top of the structure. In the multi-layer mirror system 145, the Mo layers 130 act as scattering layers, whereas the silicon layers function as separation layers. For the scattering layers instead of Mo other elements with a high Z number may utilized, such as cobalt (Co), nickel (Ni), tungsten (W), rhenium (Re) and iridium (Ir).

The multi-layer structure 145 on the substrate 110 acts a mirror for EUV electromagnetic radiation. In order to become a photolithographic mask 100, a buffer structure 160 and an absorbing structure 170 are additionally deposited on the capping layer iso. The buffer layer 160 may be deposited to protect the multi-layer mirror structure 145 during the further processing, for example during etching or repairing of the absorbing structure 170. Possible buffer structure materials are for example of fused silica ($SiO_2$), silicon-oxygen-nitride (SiON), ruthenium (Ru), chromium (Cr), and/or chromium nitride (CrN). The absorbing structure 170 comprises a material having a large absorption constant for photons in the EUV wavelength range. Examples of these materials are chromium (Cr) and/or tantalum nitride (CrN). A thickness of about 50 nm is sufficient to absorb essentially all EUV photons 180 incident on the absorbing structure 170. In contrast, the majority of the photons 180 incident on the capping layer 150 is reflected as photons 190. In this context as well as on further positions of this description the term "essentially" means a numeric value of a quantity within its measurement limit.

The rear surface 125 of the substrate 110 or the rear substrate surface 125 has according to the prior art a thick metallic coating 120, wherein the thickness of the coating 120 is larger than 50 nm and is typically in the range of 100 nm to 200 nm. Typically this coating 120 comprises chromium. As will be discussed in FIG. 3, the thick metallic coating 120 is used to fix or to hold the photolithographic mask 100 by the EUV scanner or during the fabrication of the mask 100 by the application of electrostatic forces.

Figure 2:
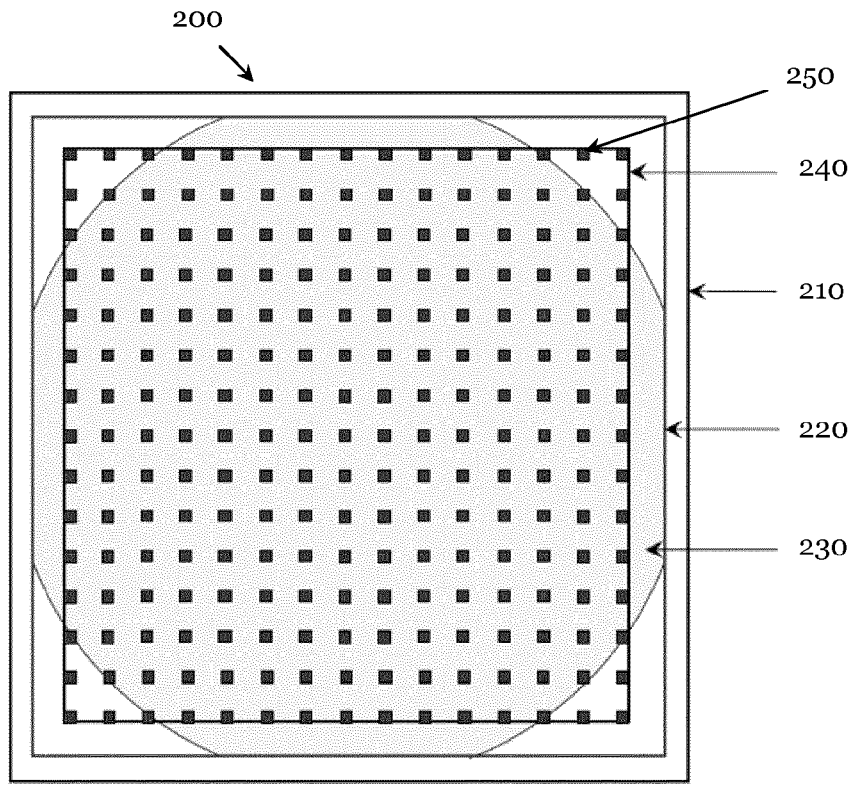
FIG. 2 depicts a schematic top view on a six inch mask and the pins of an electrostatic chuck.

FIG. 2 shows a top view of a substrate 210 of a six inch photolithographic mask 200. The substrate 210 of a six inch mask has typical lateral dimensions of 152 mm×152 mm and a thickness or height of essentially 6.35 mm. The quality area 220 determines the outer physical dimensions of the mask substrate 210 and is essentially identical to the area 230 where pattern elements formed from the absorbing structure 170 of the mask 100 can be arranged. The outer dimensions or the quality area 220 is essentially 142 mm×142 mm. The inner square area 230 in FIG. 2 depicts the pin area of an electrostatic chuck. The pins 240 of the pin area 230 are indicated in FIG. 2 by black squares. The pin area 240 of the electrostatic chuck adapted to the six inch mask 200 is essentially 127 mm×127 mm.

FIG. 3 schematically represents a mask 310 hold by an electrostatic chuck 300. The electrostatic chuck 300 comprises a chuck body 320 into which an electrode 330 is arranged. The portion of the chuck body 320 below the electrode 330 forms a dielectric layer 340 having in the example of FIG. 3 a thickness $t_D$. A voltage source 350 applies a voltage between the electrode 330 of the electrostatic chuck 300 and the mask 310 and thus forming a capacitor with the electrodes 330 and 310 with the dielectric layer 340 in between. In contrast to the pin arrangement 250 of FIG. 2, the electrostatic chuck 310 of FIG. 310 does not have a pin arrangement, but the surface of the chuck body directed toward the mask 310 is flat.

FIG. 4 presents the mask 310 of FIG. 3 in more detail. The substrate 410 has again a front surface 415 and a rear surface 425. The substrate 410 of a photolithographic mask 400 is not flat but has two bumps. A single MoSi layer 430 is arranged on the front substrate surface 415 which reproduces the imperfections of the front substrate surface 415. The further 39 MoSi layers and the absorbing structure of FIG. 1 have been removed. The coating of the remaining MoSi layers will typically also reproduce imperfections of the front substrate surface 415. In rare lucky cases the coating of the remaining 39 MoSi layers will smooth the imperfections of the front substrate surface 415, so that the upper layer shows fewer imperfections than the MoSi layers close to the front substrate surface 415 of the substrate 410 of the photolithographic mask 400. In contrast, there is a much higher probability that the deposition of the remaining MoSi layers will aggravate the imperfections of the front substrate surface 415.

When fixing the photolithographic mask 400 at an EUV scanner for example by the electromagnetic chuck 310 of FIG. 3, the irregularities of the front substrate surface 415 lead to aberrations compared with the essentially ideal photolithography mask 100. The aberrations caused by the uneven front substrate surface 415 can neither be removed by varying the position of the wafer nor by changing the reproduction scale. As already discussed, deviations from the flatness of the front substrate surface 415 in the range of 1 nm (nanometer) are already sufficient to induce aberrations.

As already mentioned, by locally depositing ultra-short light pulses of a light beam in the substrate 410 of the photolithographic mask 400 the unevenness of the front substrate surface 415 can be corrected. However, the light pulses of the light beam can neither penetrate the front substrate surface 115, as they are absorbed by the multi-layer mirror structure 145, nor the rear substrate surface 125, as they are absorbed either by the multi-layer structure 145 or by the metallic coating 120 on the rear substrate surface 125.

Therefore, the thick metallic coating 120 of FIG. 1 has been replaced in FIG. 4 by an electrically conducting and optically transparent coating 450. The electrically conductive and optically transparent coating 450 enables to irradiate the substrate 410 and the completely manufactured photolithographic mask 400 with light pulses in particular with ultra-short light pulses of a laser beam through the rear substrate surface 425.

An EUV mirror may have the structure of the photolithographic mask 100, unless it does not have the capping structure 160 and the absorbing structure 170. Therefore, the electrically conductive and optically transparent coating 450 may also be deposited on a substrate of an EUV, so that ultra-short light pulses are able to enter into the substrate from the rear substrate surface.

The electrically conductive and optically transparent coating 450 of an EUV mask 400 has additionally to fulfil specific demands which are connected with the specific handling of EUV masks. The following table presents data of three thin metallic coating. These samples fulfil the predetermined electrical and optical requirements of rear side coatings of EUV photolithographic masks.

TABLE 1

Material and geometrical parameters of the investigated sample coatings Investigated samples

| Parameter | Sample A | Sample B | Sample C |
| --- | --- | --- | --- |
| Material | Nickel | Nickel | Nickel |
| Thickness [nm] | 4 | 6 | 8 |
| Sheet resistance [Ω/sq] | 75.0 | 55.0 | 47.0 |
| Sheet resistance [Ω/sq] | 75.0 | 54.9 | 46.8 |
| Transmittance [%] at 532 nm | 55.4 | 48.6 | 52.7 |
| Transmittance [%] at 800 nm | 50.6 | 44.2 | 46.4 |
| Post-deposition oxygen plasma treatment [min] | 0 | 10 | 30 |

The sheet resistance data in the lower line indicates the numerical values after keeping the sample at room temperature in open air. As can be seen from table 1, there is no significant change with respect to the initial sheet resistance values which indicates that the high environmental stability of the deposited coating layers.

Furthermore, two additional samples were fabricated. These samples are also nickel (Ni) layers having a thickness of 3 nm or 8 nm, respectively. The 8 nm thick sample was thermally treated in an oven at 200° C. for one hour in ambient air. The 3 nm thick Ni sample gave a sheet resistance of 120 Ω/sq and a transmittance of 68%. The thermally treated 8 nm thick Ni sample had a sheet resistance of 28 Ω/sq and a transmittance of 40%.

In the following, investigations will be presented which demonstrate that these sample coatings also have the mechanical properties which allow handling of the EUV mask with an electrostatic chuck during the operation lifetime of the EUV mask. For this purpose, a nano-mechanical characterization of three different coatings in Table 1 has been performed. They reveal the mechanical properties of the coatings deposited on a substrate. The substrate applied for the following investigations was a LTE titania silicate glass (ULE®, Corning code 7972). The substrate had dimensions of 12 mm×12 mm with a thickness or height of 6 mm.

The coating layers for the three individual samples were deposited on the substrate by using an ion sputtering technique. For this purpose a substrate sample was introduced in a high vacuum chamber of a sputtering apparatus (Aja Orion with an installed substrate bias). The deposition process comprises at least three parts, which are all performed in the high vacuum chamber of the sputtering machine.

The first part comprises a plasma cleaning process in order to remove impurities and/or contaminants from the substrate surface. The plasma for the cleaning process is generated by the substrate bias of the sputtering machine. Table 2 summarizes the most relevant parameter of the plasma cleaning process.

TABLE 2

Main parameters of the plasma cleaning process

| Parameter | Numerical value |
|---|---|
| Process pressure | $2 \cdot 10^{-4}$ mTorr |
| Bias power | 80 W |
| Bias voltage | 140 V |
| Argon gas flow | 25 sccm |
| Substrate holder rotation velocity | 0.7 Hz |
| Time | 300 s |

(sccm: standard cubic centimeters per minute)

The second part involves the actual deposition process which is a physical vapour deposition; in particular a sputtering deposition method is applied for the fabrication of the sample coatings discussed in this description.

In order to control the thickness of the coating deposited on the substrate and also for the formation of an extremely homogeneous layer, it is important to have, in general, a low energetic deposition process. Therefore, low growth rates are required in order to achieve a high coating uniformity as well as a small thickness of the deposited coating layer. Table 3 presents the most important parameter of the sputtering process.

TABLE 3

Main parameters of the sputtering deposition process

| Parameter | Numerical value |
|---|---|
| Process pressure | $2 \cdot 10^{-4}$ m Torr |
| Bias power | 100 W |
| Bias voltage | 400 V |
| Argon gas flow | 25 sccm |
| Substrate holder rotation velocity | 0.7 Hz |
| Sputtering rate | 0.089 nm/s |

The third part comprises the production of an external oxide layer by applying a post-deposition plasma treatment onto the previously deposited coating layer. The post-plasma treatment is again generated by the substrate bias. Table 4 summarizes the most relevant parameters of the post-deposition plasma process.

TABLE 4

Main parameters of the post-deposition plasma treatment

| Parameter | Numerical value |
|---|---|
| Process pressure | $2 \cdot 10^{-4}$ mTorr |
| Bias power | 80 W |
| Bias voltage | 120 V |
| Oxygen gas flow | 20 sccm |
| Substrate holder rotation velocity | 0.7 Hz |

The time of the post-deposition plasma treatment depends on the desired level of the deposited coating. When introducing nitride instead of oxygen in the vacuum chamber, a defined amount of the deposited coating can be nitrided. It is also conceivable to apply a mixture of oxygen and nitrogen for a passivation of the deposited coating layer.

In a first part, static load indentation measurements of the substrate as well as of the three coatings of table 1 are presented by using a Berkovich tip and a spherical sapphire tip. In a second part nano-scratch friction tests again for the substrate and the three coating samples of table 1 using the spherical sapphire tip are discussed. Furthermore, nano-scratch friction measurements performed with cylindrical glass flat punch tip are also presented.

Static load indentation measurements have been performed using a three-sided pyramidal diamond Berkovich tip (reference: TB-14990). The Berkovich tip was calibrated on a ULE® glass sample as substrate. The measurements were carried in the continuous stiffness measurement (CSM) operation mode, by controlling the AC load to give a 2 nm harmonic displacement amplitude at 45 Hz. The samples were allowed to thermally equilibrate with the instrument (Nano Indenter XP (MTS Agilent) until the drift rate measured was below 0.050 s$^{-1}$. A total number of 15 indentation measurements were carried out at a constant strain rate of 0.050 s$^{-1}$. A Poission ratio of 0.18 was supposed for the fused silica of the substrate.

FIG. 5 shows the averaged nominal hardness (H) as a function of the penetration depth. FIG. 6 presents the Young's modulus (E) as a function of the penetration depth in the substrate material.

FIGS. 5 and 6 indicate that in spite of the fact that fused silica is a homogeneous material, the hardness and the Young's modulus depth profiles show a tendency to decrease for tip displacements into the surface below approximately 80 nm. Consequently, for shallow tip penetration the contact between the Berkovich tip and the surface of the substrate is essentially a spherical contact which gives rise to artificial low H and E values. As a consequence, the tip area coefficients were calibrated by considering the H and the E depth profiles from 100 nm to 200 nm. A hardness mean value of H=9.57±0.21 GPa was obtained from the average of the hardness profile in the range of 100 nm to 200 nm. A Young's modulus mean value of E=71.1.±0.8 GPa was obtained from the average of the hardness profile again in the range of 100 nm to 200 nm.

FIGS. 7 and 8 show the hardness and Young's modulus evolution of the coatings as a function of the tip displacement (depth) determined by nano-indentation by using the procedure described at the discussion of FIGS. 5 and 6. For each coating again a total number of 15 indentations were carried out at a constant strain rate of 0.050 s$^{-1}$, up to a penetration depth of 200 nm.

FIGS. 7 and 8 reveal that the coatings of the three different samples do not show significant differences. On the other hand, both the hardness and the Young's modulus depth profiles show an exponential increase behaviour which tends to asymptotic values of 8 GPa for the hardness and 65 GPa for the Young's modulus. These numerical values are in the range of 80% to 90% of the substrate values. The intrinsic hardness and Young's modulus values of the three coatings are difficult to determine from these curves, because the layer thickness is very small (<10 nm) and therefore the mechanical influence of the underlying substrate becomes important.

In practice, it is widely assumed that a layer thickness of ten times larger the indentation depth is sufficient to neglect the influence of the substrate (the one-tenth rule) for the coating hardness evaluation. Since the analysed coating is <10 nm, the minimum indentation depth for preventing the substrate mechanical effect would be less than 1 nm, which is far below the tip rounding of the indenter. On the other hand, because the elastic field stress induced below an indent extends to a much greater depth than the plastic zone, the one-tenth rule is no longer valid for the determination of the intrinsic Young's modulus value of these coatings.

The observed decrease in the hardness and the E modulus for tip displacements below 10 nm is due to two effects. The tip rounding as also observed for the fused silica reference substrate and is indicated in FIGS. 4 and 5. The hardness of the coating and its E modulus is below the respective numerical values of the substrate.

FIG. 9 schematically illustrates the arrangement for applying static load indentation measurements using a spherical sapphire tip instead of the Berkovich tip. The spherical sapphire tip has a radius of 79 μm (reference BR11526) (in FIG. 9 not indicated). The maximum applied force was 12 mN. The measurements were carried out using again the continuous stiffness measurement (CSM), controlling the AC load to give a 2 nm harmonic displacement amplitude at 45 Hz. The three sample coatings were allowed to thermally equilibrate with the measurement instrument until the drift rate measured was below 0.050 s$^{-1}$. For each coating, five individual indentations were performed at a constant strain rate of 0.050 s$^{-1}$ up to a maximum penetration depth of about 85 nm.

FIG. 10 schematically represents the mechanical response of a material to a spherical indentation in the elastic regime, i.e. when no permanent deformation is induced on the material and the material deformation is fully elastically recovered. Under an elastic contact, the relationship between the applied normal load (F) and the total tip displacement into the surface (h) is given by the Hertz equation ("On the measurement of stress-strain curves by spherical indentation", E. G. Herbert, G. M. Pfarr, W. C. Oliver, B. N. Lucas, J. L. Hay, Thin Solid Films, 398-399 (2001), pp. 331-335):

$$F = \frac{4}{3} \cdot E_r \cdot \sqrt{R} \cdot h^{3/2} \quad (1)$$

where R is the tip radius, and $E_r$ is the reduced Young's modulus which is given by the expression:

$$\frac{1}{E_r} = \frac{1-\vartheta_i^2}{E_t} + \frac{1-\vartheta_s^2}{E_x} \quad (2)$$

where $E_i$ and $E_s$ are the Young's modulus of the tip indenter and the sample, respectively; $\theta_i$ and $\theta_s$ are Poisson's ratio values of the tip indenter and the sample, respectively.

FIG. 11 (left part) schematically illustrates the loading-unloading indentation curve for an elastic contact, wherein no permanent deformation is induced in the material. FIG. 11 (right part) schematically represents the loading-unloading curve for an elasto-plastic contact, i.e. a permanent residual imprint is formed on the surface.

The analysis of Hertz provides two further expressions. The first one is a simple relationship between the total displacement into the sample (h) and the contact depth ($h_c$):

$$h = 2 \cdot h \quad (3)$$

The second equation is the Hertz's relationship between the total displacement into the sample (h) and the contact radius (a):

$$h = \frac{a^2}{R} \quad (4)$$

Accordingly, the indentation stress or the mean contact pressure (o) and the indentation force (F) is given by:

$$\sigma_c = \frac{F}{\pi \cdot a^2} \quad (5)$$

By using equation 4, equation 5 can for an elastic-indentation be rewritten in the form:

$$\sigma_c = \frac{F}{\pi \cdot R \cdot h} \quad (6)$$

FIG. 12 shows the indentation load (F) as a function of the total tip displacement (h) for the three coating layers defined above, wherein the coating layers are deposited on the fused quartz reference sample used as substrate. As can be seen from FIG. 12, no significant differences are observed between the three samples. The loading and the unloading curves overlap, which indicates that the contact between the spherical sapphire tip and the coating layer is purely elastic. This fact is confirmed by the linear relationship between the indentation load (F) as a function of $h^{3/2}$ presented in FIG. 13.

From the fitting of the three curves in FIG. 13 a composite Young's modulus of the coating-substrate system ($E_s$) can be estimated. Inserting the numerical values $E_i \approx 400$ GPa and $\theta_i \approx 0.3$ in the Hertz equation (equation 2) the following values are obtained:

TABLE 5

Young's modulus of a composite coating-substrate system

| Sample | $E_s$ [GPa] |
|---|---|
| Coating A | ~42 |
| Coating B | ~44 |
| Coating C | ~42 |

The results of the measurement with the spherical sapphire tip are in line with the nano-indentation measurements using the Berkovich tip (cf. FIGS. 7 and 8).

On the other hand, it can be seen from FIG. 13 that an indentation load of 12 mN results in a total tip penetration of 84 nm in the elastic regime. This tip penetration corresponds to a contact depth of $h_c$=42 nm and a contact radius a=2.58 μm. The elastic contact between the spherical tip and the substrate-coating systems of the three samples under these indentation conditions is depicted in FIG. 9.

From FIG. 12 the mean contact pressure ($\sigma_c$) can be calculated with the help of equation 6. FIG. 14 presents this relationship as a function of the total tip displacement (h). The mean contact pressure shows an increase from $1 \cdot 10^7$ Pa close to the surface to $5 \cdot 10^8$-$6 \cdot 10^8$ Pa at about 80 nm.

In the final part nano-scratch measurements are presented and discussed. FIG. 15 illustrates the apparatus used to perform the nano-scratch measurements. It comprises the spherical sapphire tip having a radius of 79 μm, already applied for the static-load spherical indentation already discussed above, and a cylindrical glass flat punch tip having a radius of 500 μm. As indicated in FIG. 15 a normal constant load of 10 mN was applied to the spherical sapphire tip. The scratch tip velocity or the profiling tip velocity was 10 μm/s. The scratch length was 100 μm. In FIG. 15, $h_s$ is the depth during performing the scratch and $h_{sc}$ defines the contact scratch depth. As explained above, for a full elastic contact $h_{sc}$ can be approximated by $h_s/2$ for a spherical indentation tip (cf. equation 3). In order to obtain representative dynamic friction coefficients a total number of 5 nano-scratch measurements have again been carried out for the fused silica reference sample used as substrate as well as for each of the three sample coatings defined in Table 1. Each nano-scratch measurement comprises three steps: (i) a pre-profiling of the entire length of the programmed scratch which is 100 μm. The normal load of the spherical sapphire tip during the pre-profiling test was 50 μN. (ii) constant load scratch with a normal load of 10 mN, and (iii) a post-profiling of the generated scratch. During the scratch measurement (in step ii) the penetration depth of the spherical tip in the material, the normal load and the lateral force are recorded. The residual depth of the induced scratch was determined from the pre- and the post-profiling, which was performed using the same spherical sapphire indenter tip at a constant profiling load of 50 μN. The dynamic friction coefficient (μ) was calculated by taking the ratio of the lateral force over the normal force (F=10 mN).

$$\mu = \frac{F_{lat.}}{F_{nor.}} \quad (7)$$

FIG. 16 presents the scratch depth 1610 of the substrate and scratch depths 1620 of the coating samples A, B and C deposited on the substrate as a function of the scratch distance. Further, FIG. 16 also shows the residual scratch depth 1630 of the substrate as well as 1640 of the coatings A, B and C. FIG. 17 represents the measurements of FIG. 16 including the error bars which results from the average of the five measurements.

As can be seen form FIGS. 16 and 17, the scratch depth comprises a range between 70 nm and 95 nm. These numerical values are close the tip displacement obtained from static-load spherical indentation, where the tip displacement into the surface was about 75 nm for a normal load of 10 mN (cf. FIG. 12). On the other hand, the scratch depth for the fused silica substrate is about 62 nm-69 nm, and is thus significantly lower than for the coating-substrate systems.

Moreover, the residual scratch depth 1640 for the three coating samples (obtained from the post-profiling measurement) is in the range of 0 nm-6 nm, whereas the residual depth of the fused silica substrate 1630 is close to 0 nm, and thus indicating a full elastic recovery of the substrate.

FIG. 18 presents the evolution of the dynamic friction coefficient as a function of the scratch distance. Similar to FIG. 17, FIG. 19 shows again the error bars of the averaged measurements.

Table 6 summarizes the mean values of the dynamic friction coefficients obtained from the average along the total scratch length for the five scratch measurements as well as for the substrate.

TABLE 6

Dynamic friction coefficients (μ) determined from nano-scratch measurements with a spherical sapphire tip (79 μm radius)

| Sample | μ |
|---|---|
| Coating A | 0.167 ± 0.009 |
| Coating B | 0.153 ± 0.011 |
| Coating C | 0.159 ± 0.007 |
| Substrate | 0.217 ± 0.018 |

By taking the error of the measurements into account, the three coatings show very similar dynamic friction coefficients of $0.15 \leq \mu \leq 0.17$ obtained with a spherical sapphire tip, whereas the fused silica substrate shows a higher dynamic friction coefficient of μ=0.22, wherein the measurements are again performed the spherical sapphire tip.

Furthermore, nano-scratch friction tests were carried out on two coatings (sample A and sample B) as well as on the LTE glass used as substrate for the coating samples by using a glass flat punch indenter which has a tip diameter of 100 μm. The scratch tip velocity was again 10 μm/s. The scratch length amounted to 1 mm. As indicated in equation 7, the dynamic friction coefficient (μ) was calculated by taking the ratio of the lateral force over the normal force (cf. equation 7).

In order to obtain representative dynamic friction coefficients a total number of 15 nano-scratch measurements have been performed for coating A and coating B. As already indicated, each nano-scratch measurements again comprises three steps: (i) a pre-profiling of the entire length of the programmed scratch (1 mm), (ii) a constant load scratch with a normal force of 580 mN, and (iii) a post-profiling of the generated scratch. During the scratch, the tip penetration depth, the normal load and the lateral force are recorded as discussed above. The dynamic friction coefficient (μ) was calculated by taking the ratio of the lateral force over the normal force, as indicated in equation 7.

FIG. 20 shows the evolution of the dynamic friction coefficients as a function of the scratch distance for coating A, coating B as well as the substrate without a coating. Similar to FIGS. 17 and 19, error bars of the 15 performed measurements are also indicated in FIG. 20.

Table 7 summarizes the mean values of the dynamic friction coefficients obtained from the average of all measurements along the total scratch length. As can be seen from FIG. 20, coating A and coating B have a dynamic friction coefficient in the range of about 0.4, whereas the LTE glass substrate shows a numerical value of $\mu$ of approximately 0.3.

TABLE 7

Dynamic friction coefficients ($\mu$) determined from nano-scratch measurements with a cylindrical glass flat punch tip (500 µm radius)

| Sample | $\mu$ |
| --- | --- |
| Coating A | 0.37 ± 0.05 |
| Coating B | 0.43 ± 0.05 |
| Substrate | 0.28 ± 0.02 |

By taking the error of the measurements into account, the coating A and the coating B show a very similar dynamic friction coefficients of $0.37 \leq \mu \leq 0.43$. On the other hand, the LTE glass substrate has a smaller dynamic friction $\mu=0.28$.

Tables 6 and 7 clearly demonstrate that a very thin metallic coating layer 450 arranged on the rear surface 425 of a substrate 410, 110 of an EUV mask 100 has a unique combination of electrical, optical and mechanical properties of the rear substrate 425. Ultra-short laser pulses can penetrate the rear substrate surface 425 having the coating 450 to correct unevenness. The electrical conductivity of the defined coating is high enough for a secure handling of EUV masks and/or EUV optical elements with electrostatic chuck. Moreover, although very thin, the defined coating is abrasion resistant to withstand the handling of the EUV mask 100 with an electrostatic chuck during the EUV mask operation life-time.

The invention claimed is:

1. A substrate for a photolithographic mask comprising a coating deposited on a rear surface of the substrate, the coating comprising:
  a. at least one electrically conducting layer, wherein the at least one electrically conducting layer comprises at least one first layer comprising at least one first layer comprising at least one metal and at least one second layer comprising at least one metal nitride, and wherein the at least one metal of the at least one first layer comprises nickel (Ni), chromium (Cr) or titanium (Ti);
  b. wherein a thickness of the at least one electrically conducting layer is smaller than 30 nm;
  c. wherein the at least one electrically conducting layer comprises an optical transmittance of more than 20% in the wavelength range of 300 nm to 1100 nm; and
  d. wherein the at least one second layer protects the at least one first layer.

2. The substrate of claim 1, wherein the at least one electrically conducting layer comprises an optical transmittance of more than 40%.

3. The substrate of claim 1, wherein the at least one electrically conducting layer comprises a sheet resistance of smaller than 200 $\Omega$/sq.

4. The substrate of claim 1, wherein the at least one electrically conducting layer comprises at least one metal and/or wherein the at least one metal comprises aluminum (Al), gold (Au), silver (Ag), copper (Cu), wolfram (W), indium (In), platinum (Pt), molybdenum (Mo), rhodium (Rh) and/or zinc (Zn) or mixtures of at least two of these metals.

5. The substrate of claim 1, wherein the at least one electrically conducting layer comprises graphene and/or a multilayer structure of graphite.

6. The substrate of claim 1, wherein the at least one electrically conducting layer comprises at least one first layer and at least one second layer, wherein the at least one first layer comprises at least one first metal and the at least one second layer comprises at least one second metal and/or graphene.

7. The substrate of claim 1, wherein the at least one electrically conducting layer comprises at least one first layer comprising at least one metal and at least one second layer comprising at least one metal oxide and/or at least one metal nitride.

8. The substrate of claim 1, wherein the at least one electrically conducting layer comprises at least one first layer comprising at least one graphene single layer or graphene multilayer structure and at least one second layer comprising at least one metal oxide and/or at least one metal nitride.

9. The substrate of claim 1, wherein the substrate comprises a material having a low thermal expansion coefficient, and/or wherein the substrate comprises fused silica.

10. The substrate of claim 1, wherein the at least one electrically conducting layer comprises an area of 148 mm×148 mm, and/or wherein the thickness of the at least one layer varies less than ±5% across the area of the at least one layer.

11. The substrate of claim 1, wherein a composite Young's modulus of the at least one electrically conducting layer deposited on the substrate and the substrate comprises a range of 20 GPa-70 GPa.

12. The method of claim 1, further comprising the step of forming a metal oxide from a metal in the at least one electrically conducting layer using a thermal treatment of the at least one electrically conducting layer in an ambient atmosphere and/or using a thermal treatment in an oxygen plasma atmosphere.

13. The substrate of claim 1 in which the at least one electrically conducting layer has an optical transmittance of more than 60% and a sheet resistance of smaller than 200 $\Omega$/sq.

14. The substrate of claim 1 in which the at least one electrically conducting layer has an optical transmittance of more than 60% and the at least one layer comprises at least one of nickel (Ni), chromium (Cr), aluminum (Al), gold (Au), silver (Ag), copper (Cu), titanium (Ti), wolfram (W), indium (In), platinum (Pt), molybdenum (Mo), rhodium (Rh), or zinc (Zn), or a mixture of at least two of these metals.

15. The substrate of claim 1 in which the at least one electrically conducting layer has an optical transmittance of more than 60% and the at least one electrically conducting layer comprises graphene and/or a multilayer structure of graphite.

16. The substrate of claim 1 in which the at least one electrically conducting layer has an optical transmittance of more than 60% and the at least one electrically conducting layer comprises at least one first layer and at least one second layer, wherein the at least one first layer comprises at least one first metal and the at least one second layer comprises at least one second metal and/or graphene.

17. The substrate of claim 1 in which the at least one electrically conducting layer has an optical transmittance of more than 60% and the at least one layer comprises at least one first layer comprising at least one metal and at least one second layer comprising at least one metal oxide and/or at least one metal nitride.

18. The substrate of claim 1 in which the thickness of the at least one electrically conducting layer is smaller than 20 nm.

19. The substrate of claim 1 in which the thickness of the at least one electrically conducting layer is smaller than 10 nm.

20. The substrate of claim 1, wherein the at least one electrically conducting layer comprises an optical transmittance of more than 60%.

21. The substrate of claim 1, wherein the at least one electrically conducting layer comprises a sheet resistance of smaller than 100 Ω/sq.

22. The substrate of claim 1, wherein the at least one electrically conducting layer comprises a sheet resistance of smaller than 50 Ω/sq.

23. The substrate of claim 1, wherein the thickness of the at least one layer varies less than ±2% across the area of the at least one layer.

24. The substrate of claim 1, wherein a composite Young's modulus of the at least one electrically conducting layer deposited on the substrate and the substrate comprises a range of 30 GPa-60 GPa.

25. The substrate of claim 1, wherein a composite Young's modulus of the at least one electrically conducting layer deposited on the substrate and the substrate comprises a range of 40 GPa-50 GPa.

26. A method for depositing a coating on a substrate of a photolithographic mask, the method comprising:
   a. depositing at least one electrically conducting layer on the substrate, wherein the at least one electrically conducting layer comprises at least one first layer comprising at least one metal and at least one second layer comprising at least one metal nitride, and wherein the at least one metal of the at least one first layer comprises nickel (Ni), chromium (Cr) or titanium (Ti);
   b. wherein a thickness of the at least one electrically conducting layer is smaller than 30 nm;
   c. wherein the at least one electrically conducting layer comprises an optical transmittance of more than 20% in the wavelength range of 300 nm to 1100 nm; and
   d. wherein the at least one second layer protects the at least one first layer.

27. The method of claim 26, wherein depositing the at least one electrically conducting layer comprises a physical vapor deposition method and/or wherein the physical vapor deposition method comprises a sputter deposition method.

28. The method of claim 26, wherein depositing the at least one electrically conducting layer comprises a thermal evaporation of a material of the at least one electrically conducting layer, and/or wherein depositing the at least one electrically conducting layer comprises an evaporation of the material of the at least one electrically conducting layer by an electron beam.

29. The method of claim 26, wherein the thickness of the at least one electrically conducting layer is smaller than 20 nm.

30. The method of claim 26, wherein the thickness of the at least one electrically conducting layer is smaller than 10 nm.

31. A substrate for a photolithographic mask comprising a coating deposited on a rear surface of the substrate, the coating comprising:
   at least one electrically conducting layer;
   wherein a thickness of the at least one electrically conducting layer is smaller than 30 nm, and the at least one electrically conducting layer comprises at least one of graphene or a multilayer structure of graphite.

32. A substrate for a photolithographic mask comprising a coating deposited on a rear surface of the substrate, the coating comprising:
   at least one electrically conducting layer;
   wherein a thickness of the at least one electrically conducting layer is smaller than 30 nm, and the at least one electrically conducting layer comprises at least one first layer comprising at least one graphene single layer or graphene multilayer structure and at least one second layer comprising at least one of metal oxide or metal nitride.

33. A substrate for a photolithographic mask comprising a coating deposited on a rear surface of the substrate, the coating comprising:
   at least one electrically conducting layer;
   wherein a thickness of the at least one electrically conducting layer is smaller than 30 nm, the at least one electrically conducting layer has an optical transmittance of more than 60%, and the at least one electrically conducting layer comprises at least one of graphene or a multilayer structure of graphite.

34. A substrate for a photolithographic mask comprising a coating deposited on a rear surface of the substrate, the coating comprising:
   at least one electrically conducting layer;
   wherein a thickness of the at least one electrically conducting layer is smaller than 30 nm, the at least one electrically conducting layer has an optical transmittance of more than 60%, and the at least one electrically conducting layer comprises at least one first layer and at least one second layer, and
   wherein the at least one first layer comprises at least one first metal and the at least one second layer comprises at least one of a second metal or graphene.

* * * * *

UNITED STATES PATENT AND TRADEMARK OFFICE
CERTIFICATE OF CORRECTION

| | | |
|---|---|---|
| PATENT NO. | : 9,519,209 B2 | Page 1 of 2 |
| APPLICATION NO. | : 14/351192 | |
| DATED | : December 13, 2016 | |
| INVENTOR(S) | : Valerio Pruneri, Albert Carrilero and Jan-Hendrik Peters | |

It is certified that error appears in the above-identified patent and that said Letters Patent is hereby corrected as shown below:

On the Title Page

Item (72), Line 2, delete "Bacelona" and insert -- Barcelona --

Item (73), Line 3, delete "Cark" and insert -- Carl --

In the Specification

Column 1
Line 5, below "Title" insert:
-- CROSS-REFERENCE TO RELATED APPLICATIONS
This application is a National Stage application under 35 U.S.C. § 371 of International Application
No. PCT/EP2012/070260 having a filing date of October 12, 2012, which claims priority to EP
Application No. 11185280.0, filed on October 14, 2011, the entire contents of which are hereby
incorporated by reference. --

Column 12
Line 55, delete "Poission" and insert -- Poisson --

Column 14
Line 30, delete "$h=2\cdot h$" and insert -- $h=2\cdot h_c$ --
Line 41, delete "(o)" and insert -- $(\sigma_c)$ --

Column 16
Lines 52-53, delete "100 μm" and insert -- 1000 μm --

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 9,519,209 B2

In the Claims

Column 17
Lines 49-51, in Claim 1, delete "at least one first layer comprising at least one first layer comprising" and insert -- at least one first layer comprising --